United States Patent
Wang

(10) Patent No.: US 11,990,915 B2
(45) Date of Patent: May 21, 2024

(54) MULTIPLEXING DEVICE FOR DIGITAL-TO-ANALOG CONVERSION CIRCUIT AND ANALOG-TO-DIGITAL CONVERSION CIRCUIT IN STORAGE AND CALCULATION INTEGRATED CHIP

(71) Applicant: Hangzhou Zhicun (Witmem) Technology Co., Ltd., Hangzhou (CN)

(72) Inventor: Shaodi Wang, Beijing (CN)

(73) Assignee: BEIJING ZHICUN (WITIN) TECHNOLOGY CORPORATION LIMITED, Beijing (CN)

( * ) Notice: Subject to any disclaimer, the term of this patent is extended or adjusted under 35 U.S.C. 154(b) by 0 days.

(21) Appl. No.: 17/434,082

(22) PCT Filed: Apr. 3, 2019

(86) PCT No.: PCT/CN2019/081340
§ 371 (c)(1),
(2) Date: Aug. 26, 2021

(87) PCT Pub. No.: WO2020/172952
PCT Pub. Date: Sep. 3, 2020

(65) Prior Publication Data
US 2022/0140834 A1  May 5, 2022

(30) Foreign Application Priority Data

Feb. 26, 2019  (CN) .......................... 201910143140.7

(51) Int. Cl.
*H03M 1/02* (2006.01)
(52) U.S. Cl.
CPC .................... *H03M 1/02* (2013.01)

(58) Field of Classification Search
CPC ........... H03M 1/02; H03M 1/004; H03M 1/00
See application file for complete search history.

(56) References Cited

U.S. PATENT DOCUMENTS 6,965,721 B1 * 11/2005 Tullis ................... G02B 6/2826
                                                        385/137
9,959,247 B1 *  5/2018 Woo ........................ G06F 17/16
(Continued)

FOREIGN PATENT DOCUMENTS

| CN | 202444479 U | 9/2012 |
| CN | 204886925 U | 12/2015 |
| CN | 210780731 U | 6/2020 |

*Primary Examiner* — Lam T Mai

(57) ABSTRACT

A multiplexing device for a digital-to-analog conversion circuit and an analog-to-digital conversion circuit in a storage and calculation integrated chip, comprising a digital-to-analog conversion circuit (DAC) module, an analog vector-matrix multiplication operation circuit(AMAC) module, an analog-to-digital conversion circuit(ADC) module, a first many-to-one multiplexer (M1-MUX) module, a second M1-MUX module, a first one-to-many multiplexer (1M-MUX) module, a second 1M-MUX module, and a switching transistor module. At an AMAC input end, each DAC corresponds to a plurality of input ends and is shared with the first 1M-MUX module in a time multiplexing mode by means of the first M1-MUX module; at an AMAC output end, each ADC corresponds to a plurality of output ends, and is shared with the second 1M-MUX module in a time multiplexing mode by means of the second M1-MUX module; the number of DACs and ADCs is reduced, and the chip area is reduced.

7 Claims, 6 Drawing Sheets

(56) References Cited

U.S. PATENT DOCUMENTS

| | | | |
|---|---|---|---|
| 10,741,088 B1* | 8/2020 | Walker | G08G 5/0021 |
| 11,379,673 B2* | 7/2022 | Wang | G06G 7/16 |
| 2004/0113177 A1* | 6/2004 | Wynne | H03M 1/108 |
| | | | 257/200 |
| 2010/0172613 A1* | 7/2010 | Hayakawa | G02B 6/43 |
| | | | 385/18 |
| 2010/0176763 A1* | 7/2010 | Yen | H02J 7/0019 |
| | | | 320/118 |
| 2014/0176169 A1* | 6/2014 | Cheng | G01R 31/2884 |
| | | | 324/750.3 |
| 2020/0219804 A1* | 7/2020 | Jezewski | H01L 27/124 |
| 2021/0151106 A1* | 5/2021 | Wang | G06N 3/0635 |
| 2021/0303198 A1* | 9/2021 | Wang | G06F 3/0604 |

\* cited by examiner

US 11,990,915 B2

MULTIPLEXING DEVICE FOR DIGITAL-TO-ANALOG CONVERSION CIRCUIT AND ANALOG-TO-DIGITAL CONVERSION CIRCUIT IN STORAGE AND CALCULATION INTEGRATED CHIP

CROSS REFERENCE TO RELATED APPLICATION

This application claims the priority of a Chinese patent application filed with the Chinese Patent Office with an application number of 201910143140.7 on Feb. 26, 2019, the name of the application is "MULTIPLEXING DEVICE FOR DIGITAL-TO-ANALOG CONVERSION CIRCUIT AND ANALOG-TO-DIGITAL CONVERSION CIRCUIT IN STORAGE AND CALCULATION INTEGRATED CHIP", the entire content of which is incorporated into this application by reference.

BACKGROUND

The present invention relates to the field of microelectronic integrated circuits, and more particularly to a multiplexing device for a digital-to-analog conversion circuit and an analog-to-digital conversion circuit in a storage and calculation integrated chip.

The storage and calculation integrated chip architecture is currently considered to be one of the efficient hardware platforms for real-time intelligent processing of big data, and the analog vector-matrix multiplication is the core circuit of the storage and calculation integrated chip, especially the storage and calculation integrated chip based on flash memory. For a typical analog vector-matrix multiplication circuit, since the signal it processes is an analog signal, the input signal and output signal are usually digital signals. Therefore, it is usually necessary to convert a digital signal into an analog signal through a digital-to-analog conversion circuit (DAC) at the input end, and convert the processed analog signal into a digital signal through an analog-to-digital conversion circuit (ADC) at the output end, as shown in FIG. 1.

However, the areas of high-precision DACs and ADCs are usually very large. In a typical storage-calculation integrated chip, each input end is required to be connected to a DAC, and each output end is connected to an ADC, as shown in FIG. 2. This method greatly causes area waste and cost overhead.

SUMMARY

In view of this, the present invention provides a multiplexing device for a digital-to-analog conversion circuit and an analog-to-digital conversion circuit in a storage and calculation integrated chip, which shares the DAC and ADC through time division multiplexing, thereby effectively reducing the number of components, reducing the circuit area, reducing cost overhead, and conducive to integration.

In order to achieve the above objectives, the present invention adopts the following technical solutions:

A multiplexing device for a digital-to-analog conversion circuit and an analog-to-digital conversion circuit in a storage and calculation integrated chip comprises: a first many-to-one multiplexer (M1-MUX) module, a digital-to-analog conversion circuit (DAC) module, and a first one-to-many multiplexer (1M-MUX) module; The input end of the DAC module is connected to the output end of the first M1-MUX module, and the output end of the DAC module is connected to the input end of the first 1M-MUX module;

The first M1-MUX module includes a plurality of first M1-MUX units for selecting a signal from a plurality of input ends as output;

The first 1M-MUX module includes a plurality of first 1M-MUX units for outputting an input signal to different output ends;

The DAC module includes a plurality of DAC units for converting digital signals into analog signals; the input end of each DAC unit is connected to the corresponding output end of the first M1-MUX unit, and the output end of the DAC unit is connected to the input end of the corresponding first 1M-MUX unit;

Each DAC unit corresponds to a plurality of input ends, which are shared by the corresponding first M1-MUX unit and the corresponding first 1M-MUX unit in a time division multiplexing manner.

Further, the multiplexing apparatus further comprises an analog vector-matrix multiplication circuit (AMAC) module and a switching transistor module; wherein the output of the first module 1M-MUX module is connected AMAC input module through the switching transistor;

The AMAC module is composed of programmable semiconductor devices, and the threshold voltage of each programmable semiconductor device can be dynamically programmed;

The switch transistor module includes a plurality of switch transistor units for turning on or disconnecting the signal connection between the first 1M-MUX unit and the input terminal of the AMAC module;

Each row of the AMAC module is connected to its corresponding switch transistor unit.

Further, the multiplexing device further includes a second M1-MUX module, an analog-to-digital conversion circuit (ADC) module, and a second 1M-MUX module; wherein the input end of the ADC module is connected to the output end of the second M1-MUX, the output end of the ADC module is connected to the input end of the second 1M-MUX module, and the input end of the second M1-MUX module is connected to the output end of the AMAC module.

The second M1-MUX module comprises a plurality of second M1-MUX units for selecting a signal from a plurality of input ends as output;

The ADC module comprises a plurality of ADC units;

The second 1M-MUX module comprises a plurality of second 1M-MUX units for outputting an input signal to different output ends.

Further, it also comprises a controller, connected to the first M1-MUX module, the DAC module, the first 1M-MUX module, the AMAC module, the switch transistor module, the second M1-MUX module, the ADC module and the second 1M-MUX module, for controlling at each moment to select a signal from multiple input signals by the first and second M1-MUX units as the output; controlling at each moment to select an input signal to output to different output ends by the first and second 1M-MUX units; controlling the on and off of the corresponding switch transistor unit at each moment.

The controller controls the switching transistor module and the first M1-MUX module and the first 1M-MUX module connected to the DAC module in a time-division multiplexing manner, and selects the corresponding input signal to input to the AMAC module. The controller controls the second M1-MUX module and the second 1M-MUX module connected to the ADC module in a time-division multiplexing manner and selects the corresponding output signal from the output end of the AMAC module for output.

The present invention provides a multiplexing device for a digital-to-analog conversion circuit and an analog-to-digital conversion circuit in a storage and calculation integrated chip, by setting the first and second M1-MUX modules, switching transistor modules, and the first and second 1M-MUX modules, adopting specific connection relationships and control, which shares the DAC and ADC through time division multiplexing, thereby effectively reducing the number of components, reducing the circuit area, reducing cost overhead, and conducive to integration.

In order to make the above and other objectives, features, and advantages of the present invention more obvious and understandable, the following specifically refers to the preferred embodiments, and in conjunction with the accompanying drawings, are described in detail as follows.

BRIEF DESCRIPTION OF THE DRAWINGS

In order to explain the embodiments of the present invention or the technical solutions in the prior art more clearly, the following will briefly introduce the drawings that need to be used in the description of the embodiments or the prior art. Obviously, the drawings in the following description are only some embodiments of the present invention. For those of ordinary skill in the art, other drawings can be obtained based on these drawings without creative work.

DETAILED DESCRIPTION

The technical solutions in the embodiments of the present invention will be clearly and completely described below in conjunction with the accompanying drawings in the embodiments of the present invention. Obviously, the described embodiments are only a part of the embodiments of the present invention, rather than all the embodiments. Based on the embodiments of the present invention, all other embodiments obtained by those of ordinary skill in the art without creative work shall fall within the protection scope of the present invention.

Figure 1:
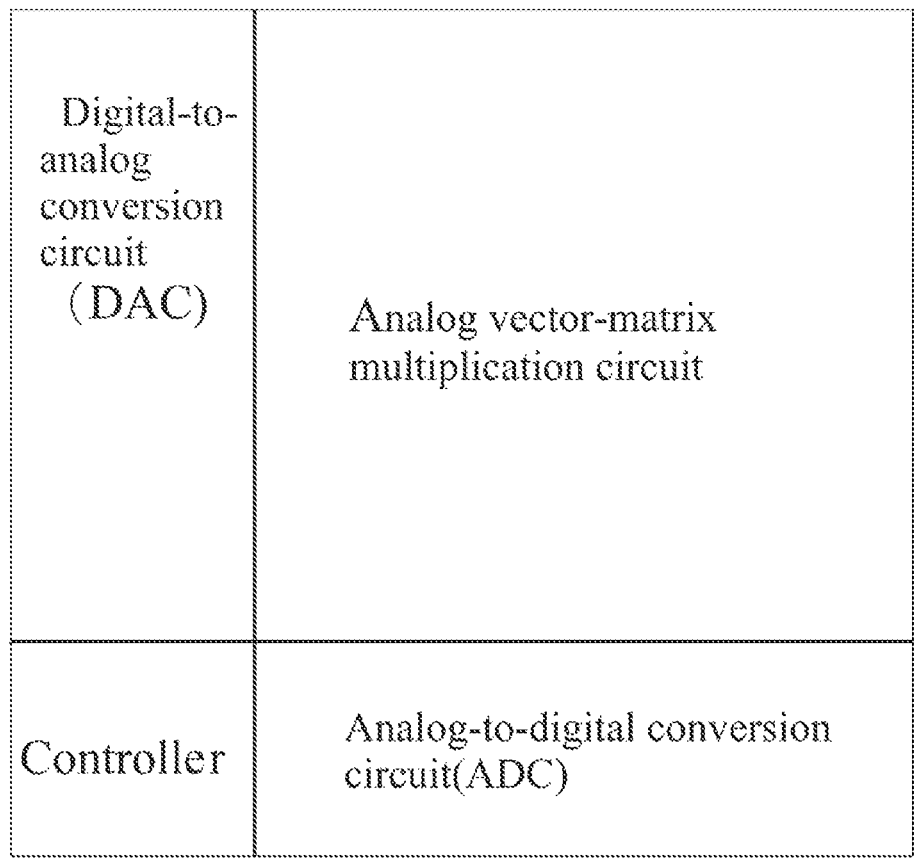
FIG. 1 is a structural block diagram of the analog vector-matrix multiplication circuit, the corresponding digital-to-analog conversion circuit and the analog-to-digital conversion circuit in a typical storage-calculation integrated chip.
Figure 2:
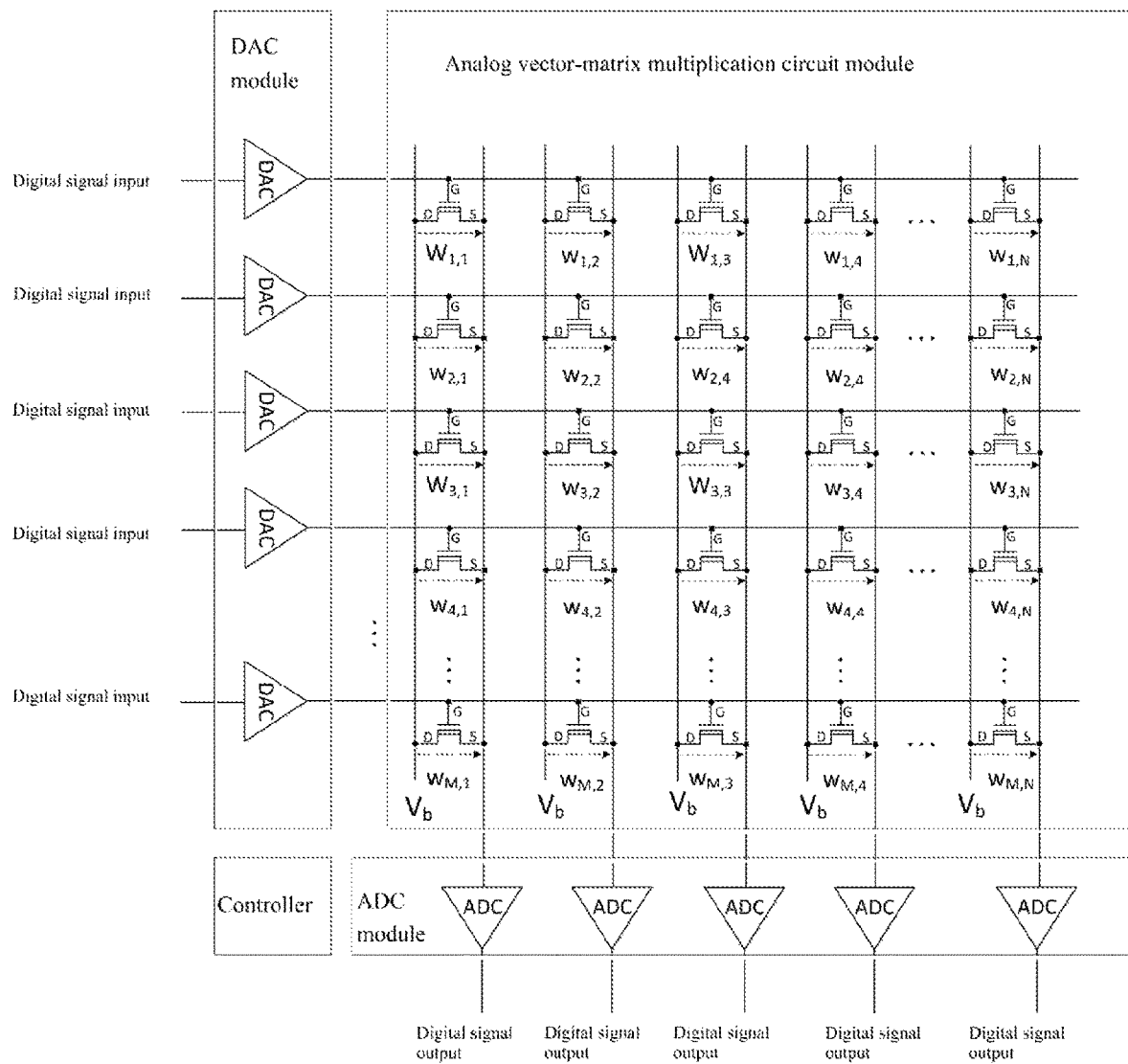
FIG. 2 is an implementation diagram of an analog vector-matrix multiplication circuit, a corresponding digital-to-analog conversion circuit, and an analog-to-digital conversion circuit in a typical storage and calculation integrated chip.

The analog vector-matrix multiplication circuit (AMAC) is the core circuit of the storage and calculation integrated chip. For a typical AMAC, since its processed signal is an analog signal, and usually its input signal and output signal are required to be a digital signal, therefore, it is usually necessary to convert the digital signal into an analog signal for input through a digital-to-analog conversion circuit (DAC) at the input end. At the output end, the processed analog signal is converted into a digital signal for output through an analog-to-digital conversion circuit (ADC), as shown in FIG. 1. In this way, each input end of the AMAC is required to be connected to a DAC, and each output end is connected to an ADC, as shown in FIG. 2. This method greatly causes area waste and cost overhead.

Figure 3:
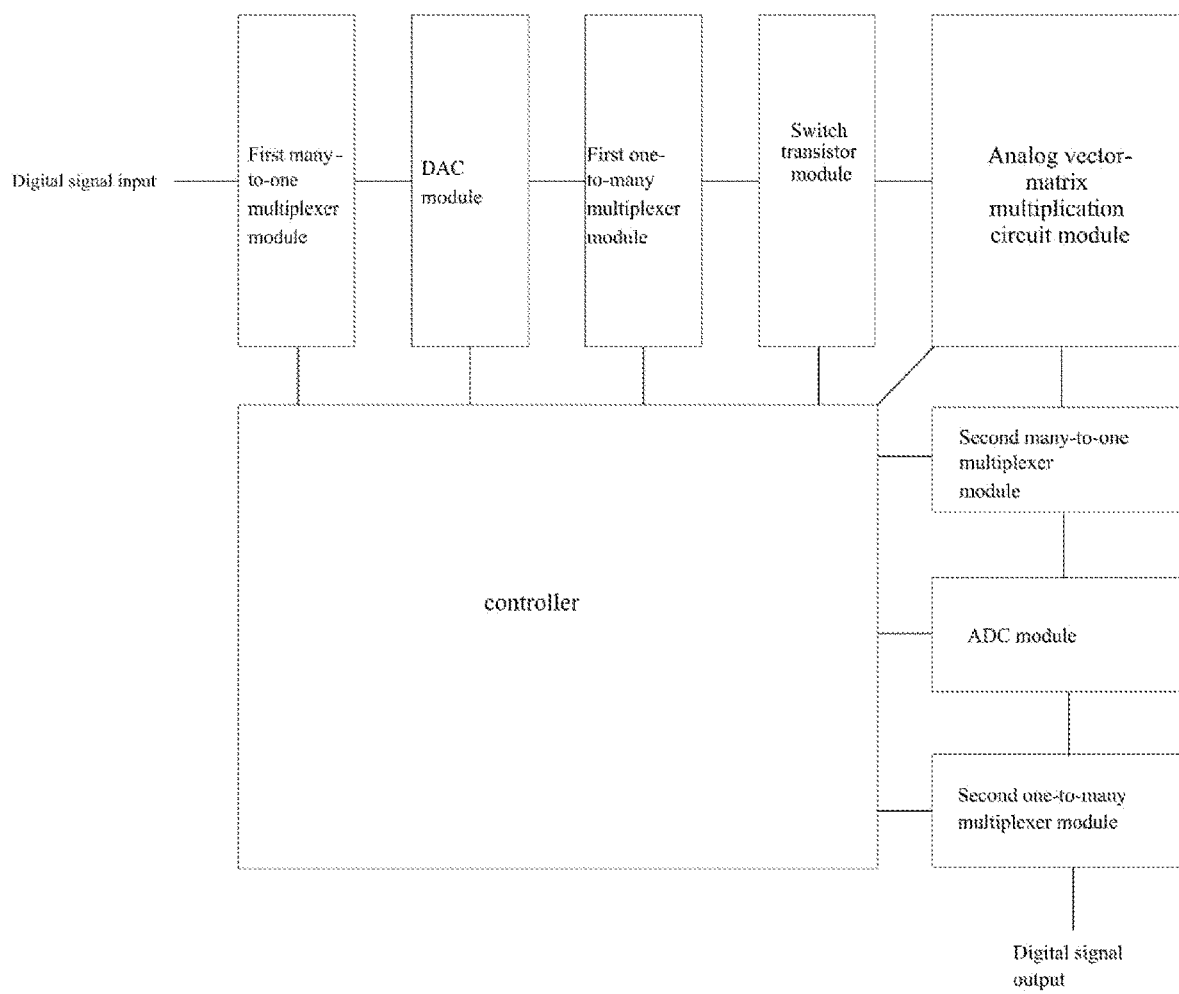
FIG. 3 is a block diagram of an embodiment of a digital-to-analog conversion circuit and analog-to-digital conversion circuit multiplexing device in a storage and calculation integrated chip of the present invention.

In order to solve the above technical problems in the prior art, an embodiment of the present invention provides a multiplexing device for a digital-to-analog conversion circuit and an analog-to-digital conversion circuit in a storage and calculation integrated chip, as shown in FIG. 3, including a first M1-MUX module, a DAC module, a first 1M-MUX module, an AMAC module, a switch transistor module, a second M1-MUX module, an ADC module and a second 1M-MUX module.

The AMAC comprising: a programmable array of semiconductor devices;

wherein, the principle of AMAC to achieve analog vector-matrix multiplication is as follows: for a programmable semiconductor device array with M rows and N columns, the sources of all programmable semiconductor devices in each column are connected to the same analog voltage input end, and N columns of programmable semiconductor devices are correspondingly connected to N analog voltage input ends. The gates of all programmable semiconductor devices are connected to the same bias voltage input end, M rows of programmable semiconductor devices are correspondingly connected to M bias voltage input ends, the drains of all programmable semiconductor devices in each column are connected to the same analog current output end, and N columns of programmable semiconductor devices are correspondingly connected to N analog current outputs end. The threshold voltage of each programmable semiconductor device can be adjusted. N is a positive integer greater than or equal to zero, and M is a positive integer greater than or equal to zero. M and N can be equal or unequal to form a topological structure of source coupling and drain summation.

By dynamically adjusting the threshold voltage $V_{TH}$ of each programmable semiconductor device according to certain rules in advance, each programmable semiconductor device can be regarded as a variable equivalent analog weight (Denoted as $W_{k,j}$, wherein $0<k<M$ and $0<j<N$ represents the row number and column number respectively), It is equivalent to storing an analog data, and the programmable semiconductor device array stores an analog data array $$\begin{bmatrix} W_{1,1} & \cdots & W_{1,N} \\ \cdot & \cdots & \cdot \\ \cdot & \cdots & \cdot \\ W_{M,1} & \cdots & W_{M,N} \end{bmatrix}.$$

When the circuit is working, apply a row of analog voltage signals $V_1 \sim V_N$ to N columns of programmable semiconductor devices, wherein, the sources of all programmable semiconductor devices in the Kth column get an analog voltage signal $V_k$, the gate input a bias voltage $V_b$, the drain output current signal $I_{k,1} \sim I_{k,N}$ separately, wherein, according to the characteristics of programmable semiconductor devices, I=V×W, the drain output current of each programmable semiconductor device is equal to the source voltage multiplied by the weight of the programmable semiconductor device, which is $I_{k,1}=V_kW_{k,1}$, $I_{k,N}=V_kW_{k,N}$, because the drains of all programmable semiconductor devices in each column are connected to the same analog current output end, according to Kirchhoff's law, therefore, the current at the analog current output end is the sum of the drain currents of all programmable semiconductor devices in the column, which is $I_j=\Sigma_{k=1}^{N}V_kW_{k,j}$, multiple analog current output ends output the sum of multiple currents ($\Sigma_{k=1}^{N}V_kW_{k,1}$, $\Sigma_{k=1}^{N}V_kW_{k,2}$, $\Sigma_{k=1}^{N}V_kW_{k,3}$ ... $\Sigma_{k=1}^{N}V_kW_{k,N}$), realize the function of matrix multiplication operation.

Of course, the programmable semiconductor device array may also adopt a topological structure of gate coupling and source summation or a topological structure of gate coupling and drain summation, which is not limited in the embodiment of the present invention.

Figure 4:
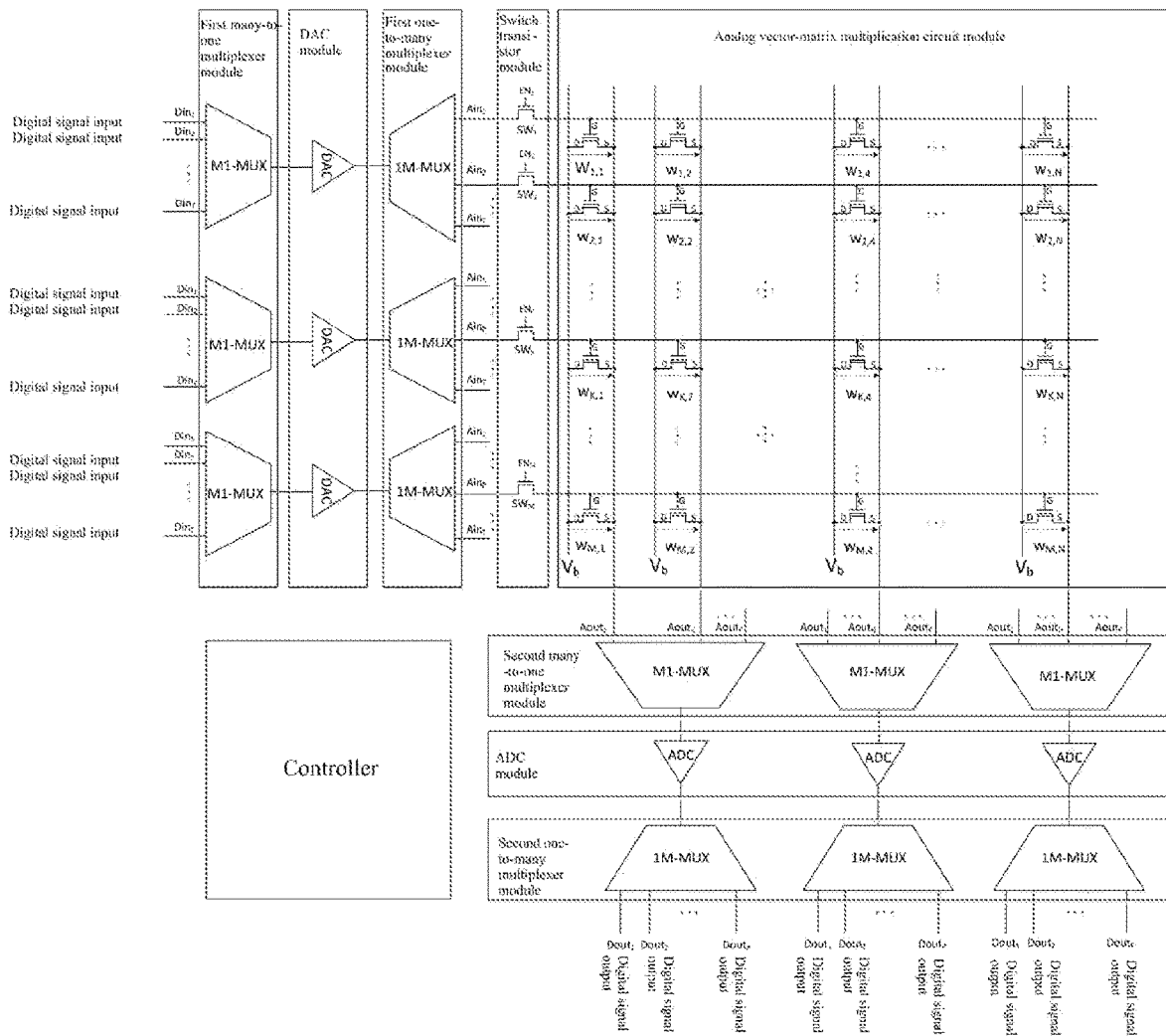
FIG. 4 is a circuit diagram of an embodiment of a digital-to-analog conversion circuit and analog-to-digital conversion circuit multiplexing device in a storage and calculation integrated chip of the present invention.

Hereinafter, the principle of the digital-to-analog conversion circuit and the analog-to-digital conversion circuit multiplexing device of the embodiment of the present invention will be described: as shown in FIG. 3 and FIG. 4, it includes a first M1-MUX module, a DAC module, a first 1M-MUX module, an AMAC module, a switch transistor module, a second M1-MUX module, an ADC module, a second 1M-MUX module, wherein, the output end of the first M1-MUX module is connected with the input end of the DAC module, and the output end of the DAC module is connected with the input end of the first 1M-MUX module, the output end of the first 1M-MUX module is connected to the input end of the AMAC module through the switch transistor module, the output end of the AMAC module is connected to the input end of the second M1-MUX module, the output end of the second M1-MUX module is connected with the input end of the ADC module, and the output end of the ADC module is connected with the input end of the second 1M-MUX module.

Each DAC is shared by multiple (for example, T) input ends of AMAC in a time-division multiplexed manner; in the same way, each ADC is shared by multiple (for example, P) output ends of AMAC in a time-division multiplexing manner to reduce the number of ADCs and DACs, thereby reducing chip area. Here T is usually T is a factor of M, for example, T takes 2, 4, 6, 8, ... etc; Here P is a factor of N, for example, P takes 2, 4, 6, 8, ... etc. The values of T and P are determined according to the actual chip area and delay.

Figure 5:
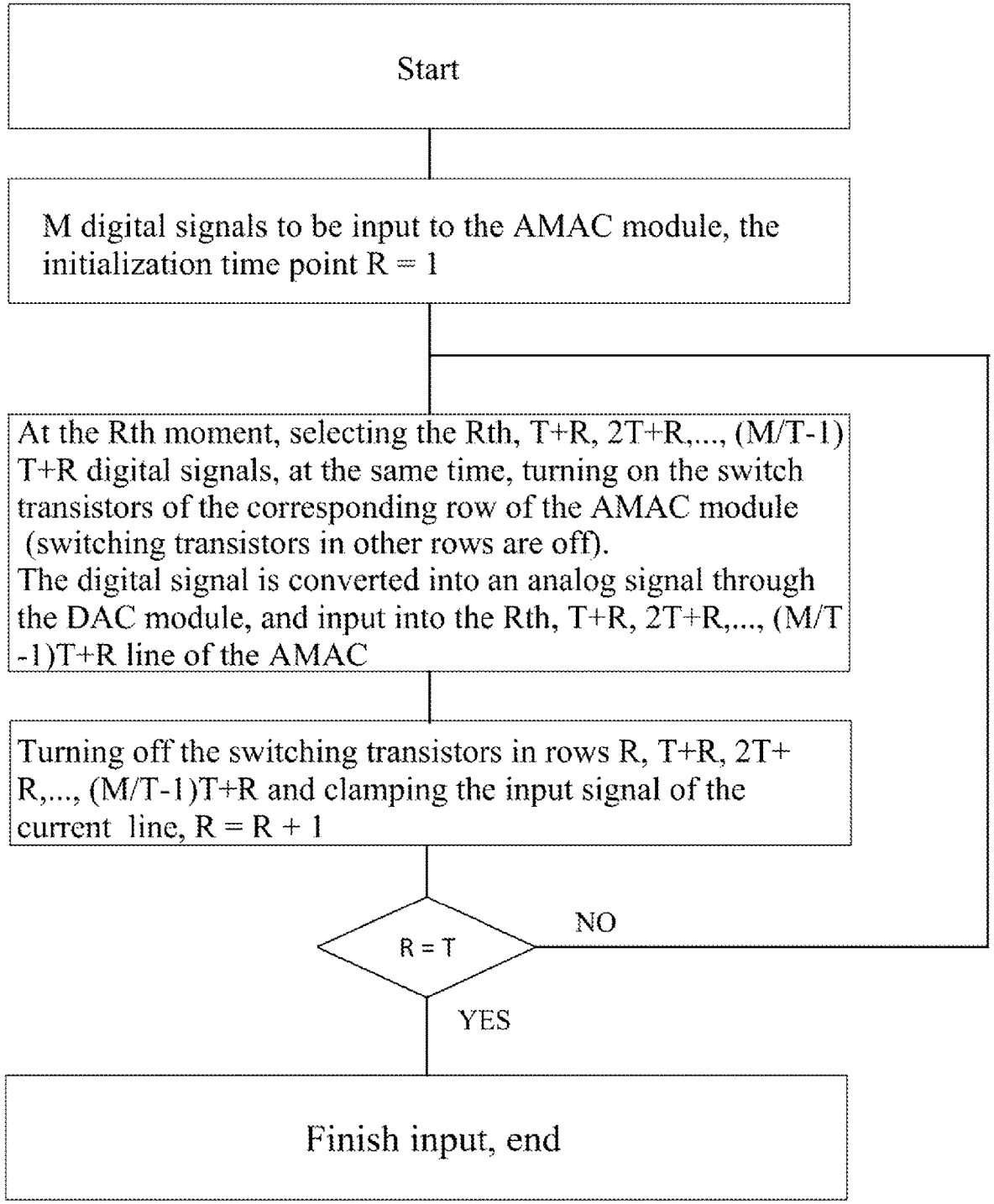
FIG. 5 is a flowchart of a method for multiplexing a digital-to-analog conversion circuit in a storage and calculation integrated chip according to the present invention.

The multiplexing method for DAC is as follows: when M digital signals need to be input to the AMAC module, the controller controls the first M1-MUX module and the first 1M-MUX module connected to the DAC module, and at the same time controls the corresponding switch transistors, inputs digital signals in time-division multiplexing manner. The details are as follows (as shown in FIG. 5): at the first moment, choose No. 1, T+1, 2T+1, ..., (M/T−1)T+1 digital signal, at the same time, the switch transistor units of the corresponding row of the AMAC module are turned on (the switch transistor units of other rows are turned off), and the digital signal is converted into an analog signal through the DAC module, input into No. 1, T+1, 2T+1, ..., (M/T−1)T+1 rows of the AMAC module; then turn off No. 1, T+1, 2T+1, ..., (M/T−1)T+1 switching transistor units, clamp the input signal of the current line; at the second moment, select No. 2, T+2, 2T+2, ..., (M/T−1)T+2 digital signal, at the same time, the switch transistor units of the corresponding row of the AMAC module are turned on (the switch transistor units of other rows are turned off), and the digital signal is converted into an analog signal through the DAC module, input into No. 2, T+2, 2T+2, ..., (M/T−1)T+2 rows of the AMAC module; then turn off No. 2, T+2, 2T+2, ..., (M/T−1)T+2 switching transistor unit, clamp the input signal of the current line; and so on, until all digital signals are input to the AMAC module; finally the analog vector-matrix multiplication operation is performed.

Figure 6:
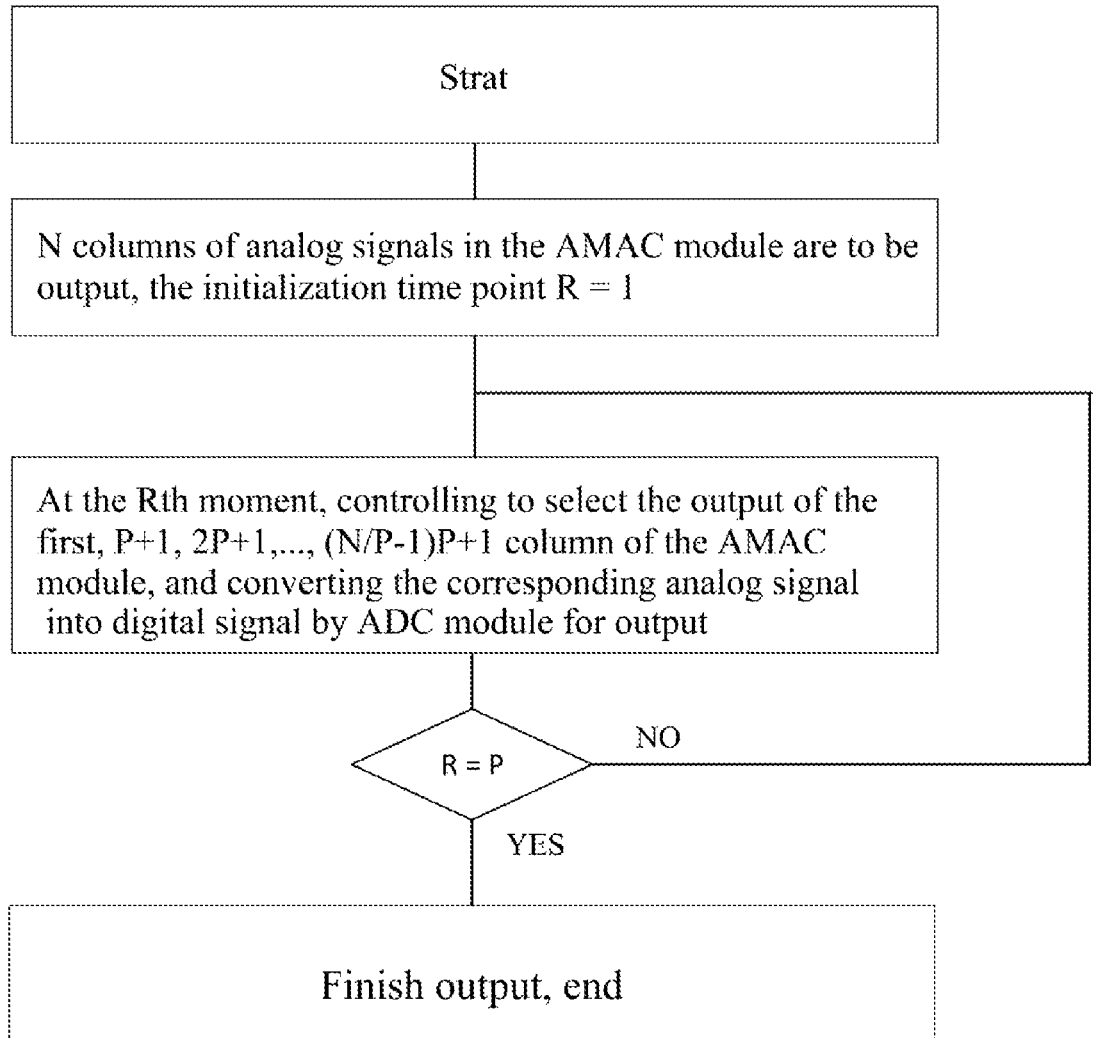
FIG. 6 is a flow chart of a method for multiplexing analog-to-digital conversion circuits in a storage and calculation integrated chip according to the present invention.

The multiplexing method for ADC is as follows (as shown in FIG. 6): when the AMAC module needs to output N analog vector-matrix multiplication operation results, the controller controls the second M1-MUX module and the second 1M-MUX module connected to the ADC module to output the operation results in time-division multiplexing manner. At the first moment, select the output end of No. 1, P+1, 2P+1, ..., (N/P−1)P+1 column of the AMAC module, the corresponding analog signal is converted into a digital signal for output through the ADC module; At the second moment, select the output end of No. 2, P+2, 2P+2, ..., (N/P−1)P+2 column of the AMAC module, the corresponding analog signal is converted into a digital signal for output by the ADC module; and so on, until the analog signals of all columns of the AMAC module are converted into digital signals and output by the ADC module.

If we adopt the existing scheme, we need to connect one DAC unit in each row and one ADC unit in each column, which requires M DAC units and N ADC units, usually M and N are relatively large, such as 1024. With the solution provided by the present invention, we only need M/T DAC units, N/P ADC units, (M/T) first M1-MUX units, (N/P) second M1-MUX units, (M/T) first 1M-MUX unit, (N/P) second 1M-MUX unit and M switching transistor units. It is worth noting that the area of each (first and second) M1-MUX unit and (first and second) 1M-MUX unit is much smaller than the area of the ADC unit and the DAC unit. Those skilled in the art can understand that the greater the M and N, and the greater the T and P, then the advantages of the present invention are more obvious.

In an optional embodiment, it further includes: a programming circuit connected to the source, gate, and/or substrate of each programmable semiconductor device for adjusting the threshold voltage of the programmable semiconductor device.

In an optional embodiment, it further includes: a controller, which controls the multiplexing process of the DAC and the DAC.

In the above embodiments, the programmable semiconductor device may use floating gate transistors.

In an optional embodiment, the analog vector-matrix multiplication circuit may further include: a conversion device, which is connected before the multiple analog voltage input ends, and is used to convert the multiple analog current input signals into analog voltage input signals, respectively, output to the corresponding analog voltage input end.

The above is only an example to illustrate the specific structure of each module of the present invention. In specific implementation, the specific structure of each module is not limited to the above-mentioned structure provided by the embodiment of the present invention, and may also be other structures known to those skilled in the art, which will not be described here.

On the other hand, an embodiment of the present invention also provides a chip, which includes the above-mentioned analog vector-matrix multiplication circuit, a digital-to-analog conversion circuit, and an analog-to-digital conversion circuit multiplexing device.

In addition, an embodiment of the present invention also provides an electronic device. The electronic device may include the above-mentioned analog vector-matrix multiplication circuit, a digital-to-analog conversion circuit, and an analog-to-digital conversion circuit multiplexing device. More specifically, the electronic device may be, for example, Personal computers, laptop computers, cellular phones, camera phones, smart phones, personal digital assistants, media players, navigation devices, email devices, game consoles, tablet computers, wearable devices, or any of these devices combination.

It should also be noted that the terms "include", "include" or any other variants thereof are intended to cover non-exclusive inclusion, so that a process, method, commodity or equipment including a series of elements not only includes those elements, but also includes Other elements that are not explicitly listed, or they also include elements inherent to such processes, methods, commodities, or equipment. If there are no more restrictions, the element defined by the sentence "including a . . . " does not exclude the existence of other identical elements in the process, method, commodity, or equipment that includes the element.

In the present invention, specific examples are used to illustrate the principles and implementation of the present invention. The descriptions of the above examples are only used to help understand the method and core idea of the present invention; at the same time, for those of ordinary skill in the art, according to this The idea of the invention will have changes in the specific implementation and the scope of application. In summary, the content of this specification should not be construed as limiting the invention.

What is claimed is:

1. A multiplexing device for digital-to-analog conversion circuit and analog-to-digital conversion circuit in a storage and calculation integrated chip, characterized in that comprising: a first many-to-one multiplexer module, a digital-to-analog conversion circuit module, and a first one-to-many multiplexer module; wherein an input end of the digital-to-analog conversion circuit module is connected to an output end of the first many-to-one multiplexer module, and an output end of the digital-to-analog conversion circuit module is connected to an input end of the first one-to-many multiplexer module;

said first many-to-one multiplexer module comprising a plurality of many-to-one multiplexer units;

said digital to analog conversion circuit module comprises a plurality of digital to analog conversion circuit units;

said first one-to-many multiplexer module comprises a plurality of first one-to-many multiplexer units.

2. The multiplexing device according to claim 1, wherein each digital-to-analog conversion circuit unit corresponds to a plurality of input ends, and is shared thought corresponding first many-to-one multiplexer units and corresponding first one-to-many multiplexer units in a time division multiplexing manner.

3. The multiplexing device according to claim 1, further comprising an analog vector-matrix multiplication circuit module and a switching transistor module; wherein the output ends of the first one-to-many multiplexer modules connected to the input end of the analog vector-matrix multiplication circuit module by the switching transistor module;

the analog vector-matrix multiplication circuit module is composed of programmable semiconductor devices, and a threshold voltage of each programmable semiconductor device can be dynamically programmed;

the switching transistor module comprises a plurality of transistor switching transistor units;

each row of the analog vector-matrix multiplication circuit module is connected to its corresponding switch transistor unit.

4. The multiplexing device according to claim 3, further comprising a second many-to-one multiplexer module, an analog-to-digital conversion circuit module, and a second one-to-many multiplexer module; wherein, an input end of the analog-to-digital conversion circuit module is connected to an output end of the second many-to-one multiplexer module, an output end of the analog-to-digital conversion circuit module is connected to an input end of the second one-to-many multiplexer module, and the input end of second many-to-one multiplexer module is connected to the output end of the analog vector-matrix multiplication circuit module;

said second many-to-one multiplexer module includes a plurality of many-to-one multiplexer units;

said analog-to-digital conversion circuit module includes a plurality of analog-to-digital conversion circuit units;

said second one-to-many multiplexer module includes a plurality of second one-to-many multiplexer units.

5. The multiplexing device according to claim 4, wherein each analog-to-digital conversion circuit unit corresponds to a plurality of output ends, and is shared thought corresponding second many-to-one multiplexer units and corresponding second one-to-many multiplexer units in a time division multiplexing manner.

6. The multiplexing device according to claim 4, further comprising a controller, connected to the first many-to-one multiplexer module, the digital-to-analog conversion circuit module, the first one-to-many multiplexer module, the analog vector-matrix multiplication circuit module, the switch transistor module, the second many-to-one multiplexer module, the analog-to-digital conversion circuit module and the second one-to-many multiplexer module, for controlling at each moment to select a signal from multiple input signals by the first and second many-to-one multiplexer units as an output; controlling at each moment to select an input signal to output to different output ends by the first and second one-to-many multiplexer units; controlling the on and off of the corresponding switch transistor unit at each moment.

7. The multiplexing device according to claim 6, wherein: the controller controls the switching transistor module and the first many-to-one multiplexer module and the first one-to-many multiplexer module connected to the DAC module in a time-division multiplexing manner, and selects the corresponding input signal to input to the analog vector-matrix multiplication circuit module; the controller controls the second many-to-one multiplexer module and the second one-to-many multiplexer module connected to the analog-to-digital conversion circuit module in a time-division multiplexing manner and selects the corresponding output signal from the output end of the analog vector-matrix multiplication circuit module for output.

* * * * *